(12) United States Patent
Roesner et al.

(10) Patent No.: US 6,460,948 B2
(45) Date of Patent: *Oct. 8, 2002

(54) DRIVE BRACKET

(75) Inventors: Arlen L. Roesner, Fort Collins, CO (US); David Mayer, Fort Collins, CO (US)

(73) Assignee: Hewlett-Packard Company, Palo Alto, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/430,333

(22) Filed: Oct. 29, 1999

(65) Prior Publication Data

US 2002/0017838 A1 Feb. 14, 2002

(51) Int. Cl.[7] ............................................... A47B 81/06
(52) U.S. Cl. ................................... 312/223.1; 361/685
(58) Field of Search .................... 312/223.1, 223.2, 312/328, 332.1, 333, 223.3, 257.1; 361/727, 685

(56) References Cited

U.S. PATENT DOCUMENTS

| | | | |
|---|---|---|---|
| 5,340,340 | * 8/1994 | Hastings et al. | 312/223.1 |
| 5,654,873 | * 8/1997 | Smithson et al. | 361/685 |
| 5,765,933 | * 6/1998 | Paul et al. | 312/223.1 |
| 5,791,753 | * 8/1998 | Pasuin | 312/223.1 |
| 6,067,225 | * 5/2000 | Reznikov et al. | 312/223.2 |
| 6,227,631 | * 5/2001 | Lin et al. | 312/223.2 |

* cited by examiner

*Primary Examiner*—Peter M. Cuomo
*Assistant Examiner*—Jerry A. Anderson
(74) *Attorney, Agent, or Firm*—Kevin M. Hart; David W. Boyd

(57) ABSTRACT

An EMI-efficient system for mounting internal peripheral devices such as disk or tape drives inside a computer enclosure so that the drives may be removed and replaced easily. A drive bracket guide is mounted to a computer enclosure chassis, a peripheral device is mounted to a drive bracket, and the drive bracket is inserted into an opening of the drive bracket guide. A socket support disposed at the end of the bracket guide opposite the opening fixedly supports a socket in position for receiving a mating socket on the drive. A locking insertion/ejection mechanism is coupled to the bracket and facilitates engagement/disengagement of the two sockets in the rear of the assembly. The bracket guide may be integrally formed on side walls of a drive cage to reduce potential for leaks of electromagnetic energy from the enclosure and to facilitate the creation of numerous bracket guides in a stack arrangement for housing multiple drives.

5 Claims, 16 Drawing Sheets

DRIVE BRACKET

FIELD OF THE INVENTION

This invention relates to methods and apparatus for mounting internal peripheral devices inside a computer enclosure. More particularly, the invention relates to an EMI-efficient technique that facilitates easy removal and replacement of such internal peripheral devices.

BACKGROUND

One common method for mounting internal peripheral devices such as disk or tape drives inside a computer enclosure has been to fasten the drive directly to the enclosure chassis or to an appendage thereof, and to manually couple a ribbon cable between the drive and the drive's controller subsystem. This method may work satisfactorily for computers wherein only one or two drives are needed and wherein the drives are to be permanently housed within the enclosure of the computer. In many modern applications, however, a need exists to house as many as four or more drives in a single enclosure. Furthermore, a need exists to be able to remove and replace the drives easily and frequently, and to do so without introducing enclosure features that allow significant electromagnetic energy to escape from the computer.

It is therefore an object of this invention to provide a mechanism for mounting multiple drives inside a computer enclosure in a manner that makes it quick and easy to remove and replace the individual drives.

It is a further object of this invention to provide such a mechanism without introducing features to the computer's enclosure that would allow significant escape of electromagnetic energy from the computer.

SUMMARY OF THE INVENTION

The invention includes numerous aspects, each of which contributes to achieving these and other objectives.

In one aspect, a drive bracket guide is mounted to a computer enclosure chassis, a peripheral device is mounted to a drive bracket, and the drive bracket is then inserted into an opening of the drive bracket guide. A socket support disposed at the end of the drive bracket guide opposite the opening fixedly supports a socket in a position suitable for receiving a mating socket on the drive. The drive bracket and the drive bracket guide cooperate to put the two mating sockets into proper alignment so that insertion of the bracket into the guide causes the sockets to connect with one another automatically, thus obviating the need for manual attachment of a ribbon cable each time a drive is installed.

In another aspect, the drive bracket may be equipped with a locking insertion/ejection mechanism that further facilitates installation and removal of the drive bracket. The insertion/ejection mechanism is rotatably coupled to the drive bracket at a point of rotation. It includes a first prong disposed on one side of the point of rotation and a lever disposed on the other side of the point of rotation. The insertion/ejection mechanism is capable of being placed in an open and a closed position. The first prong, the lever and the point of rotation are disposed so that the first prong passes at least partially through the plane of a flange on the drive bracket guide when the drive bracket is inserted into the guide while the lever is in the open position. After the bracket has been so inserted, the first prong engages a back surface of the flange when the lever is then rotated from the open position into the closed position. The engagement of the first prong with the back surface of the flange and the rotation of the lever into the closed position tend to urge the drive bracket further into the drive bracket guide, thus facilitating the mating of the two sockets at the rear of the assembly.

In another aspect, the insertion/ejection mechanism includes a second prong adjacent to the first prong. The second prong is disposed so that it does not pass through the plane of the flange when the drive bracket is inserted into the bracket guide while the lever is in the open position. Rather, the second prong remains adjacent to a front surface of the flange when the lever is rotated into the closed position. When the lever is rotated from the closed position back into the open position, the second prong engages the front surface of the flange. The engagement of the second prong with the front surface of the flange and the rotation of the lever into the open position tends to urge the drive bracket out of the drive bracket guide, thus facilitating disconnection of the two sockets in the rear of the assembly and easing removal of the bracket from the bracket guide.

In another aspect, the lever of the insertion/ejection mechanism may be spring biased toward the open position, and the mechanism may be equipped with a locking feature. A resilient standoff member is mounted to the drive bracket at one end and has a catch formed at its other end. The lever of the insertion/ejection mechanism has a hole formed therein for lockingly receiving the catch when the lever is rotated into the closed position. When it is desired to remove the bracket from the guide, the resilient standoff member is moved to one side, allowing the catch to release.

In yet a further aspect, the drive bracket guide may be integrally formed on side walls of a drive cage. In such an embodiment, not only is the potential for electromagnetic energy leakage diminished, but also numerous bracket guides may be formed in a stack arrangement along the side walls of the cage.

DETAILED DESCRIPTION OF THE PREFERRED EMBODIMENTS

Figure 1:
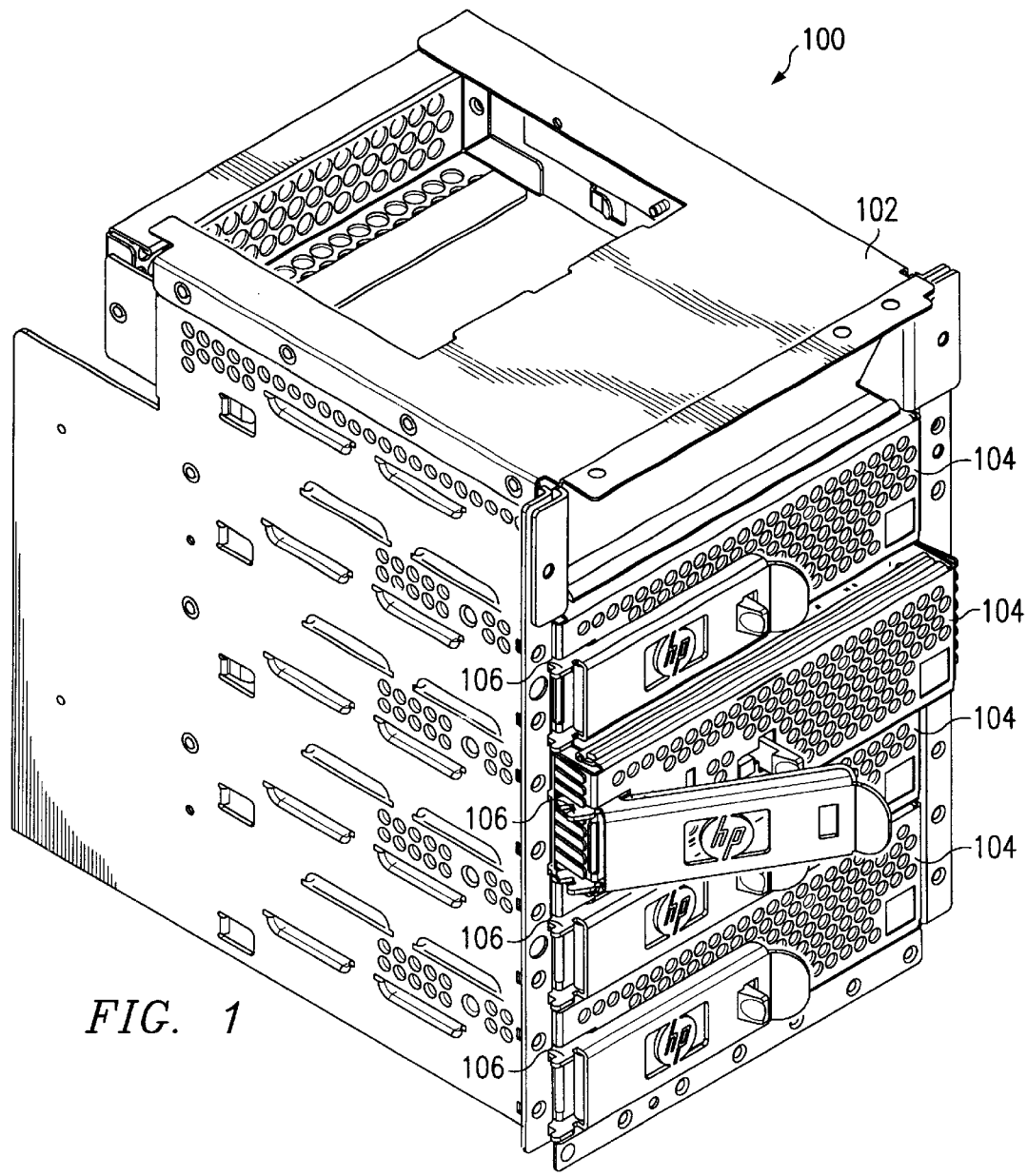
FIG. 1 is a an isometric view of a drive mounting system according to a preferred embodiment of the invention.
Figure 2:
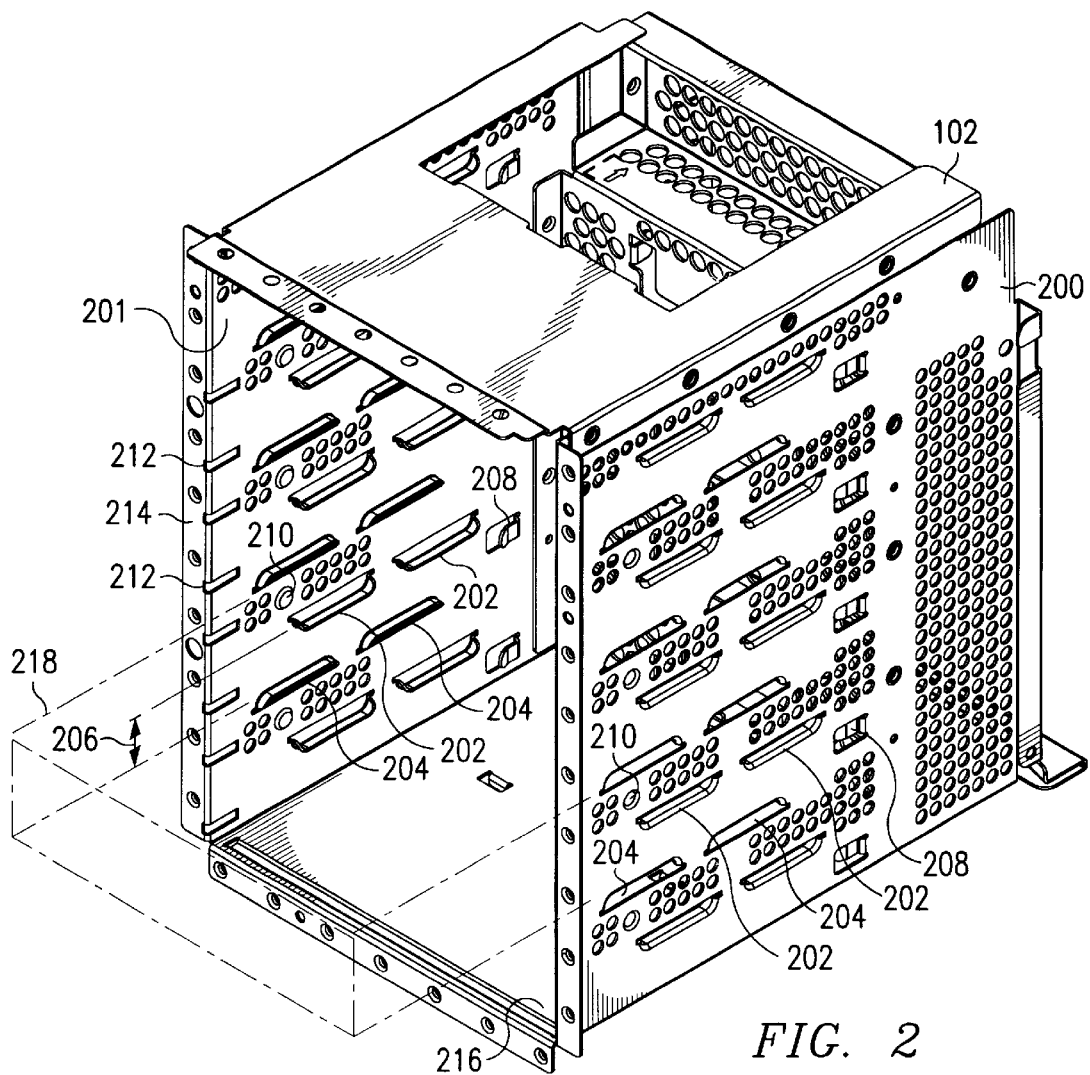
FIG. 2 is an isometric view of the drive cage of FIG. 1.
Figure 3:
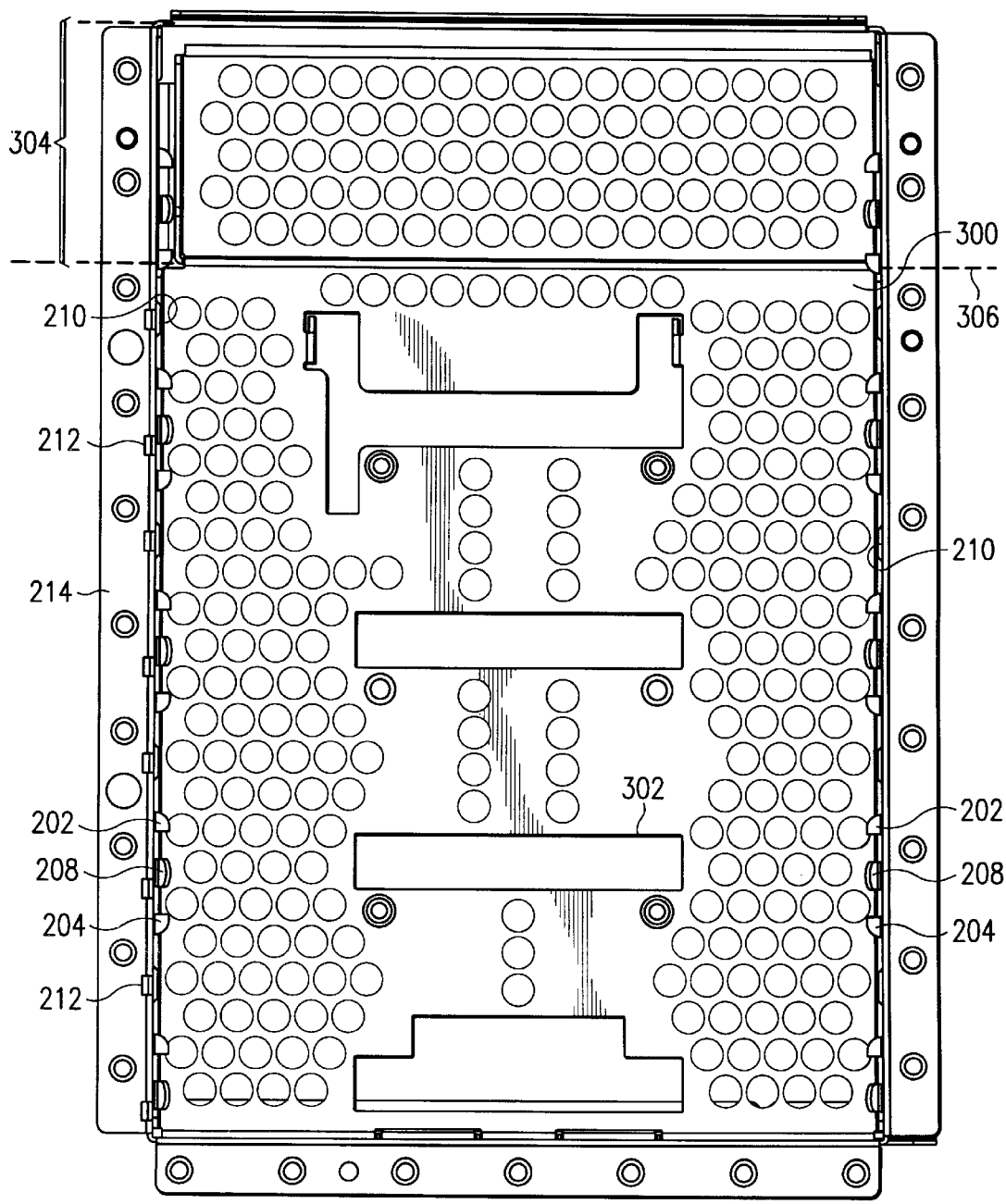
FIG. 3 is a front orthogonal view of the drive cage of FIG. 1.
Figure 4:
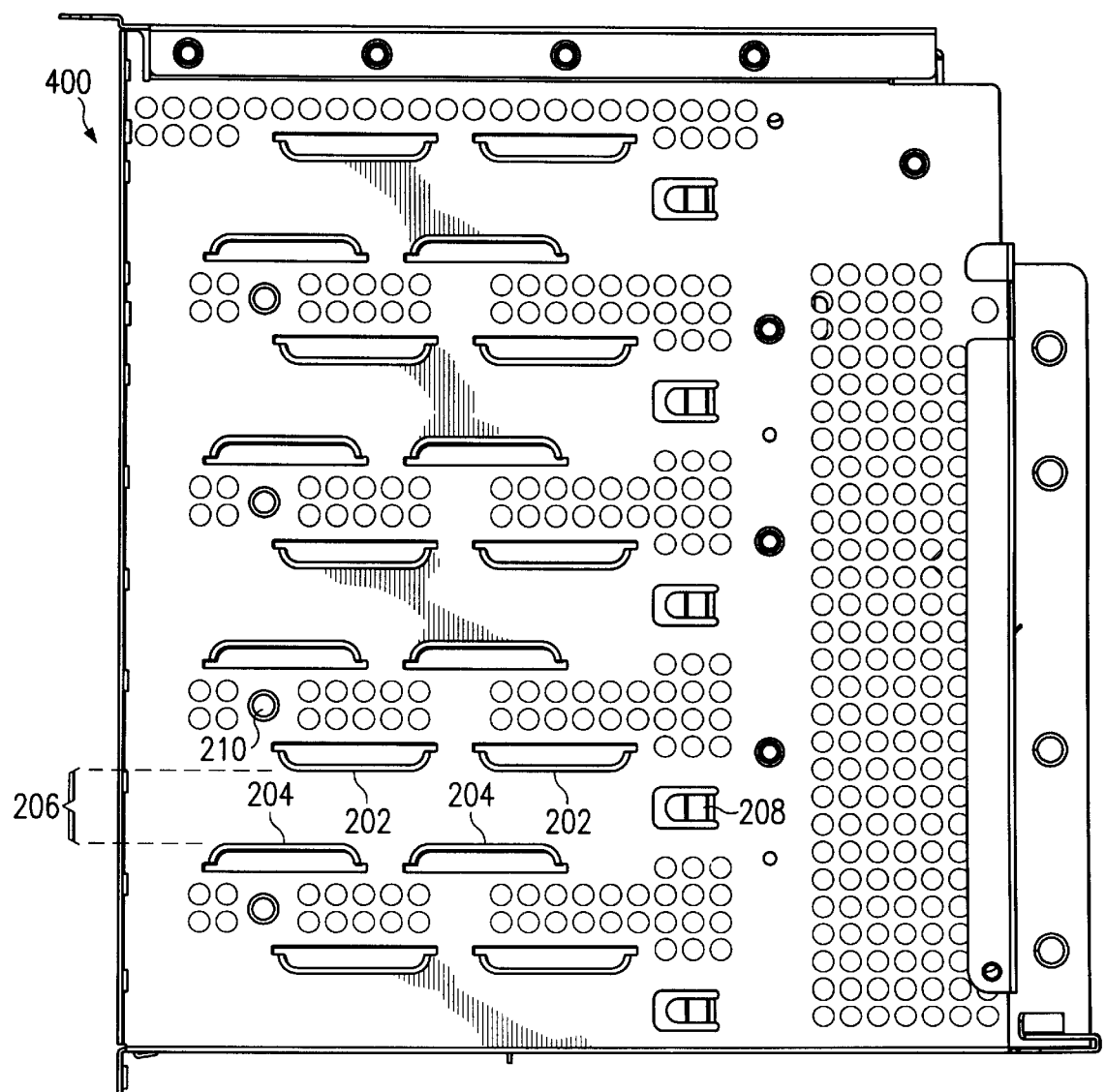
FIG. 4 Is a side orthogonal view of the drive cage of FIG. 1.
Figure 5:
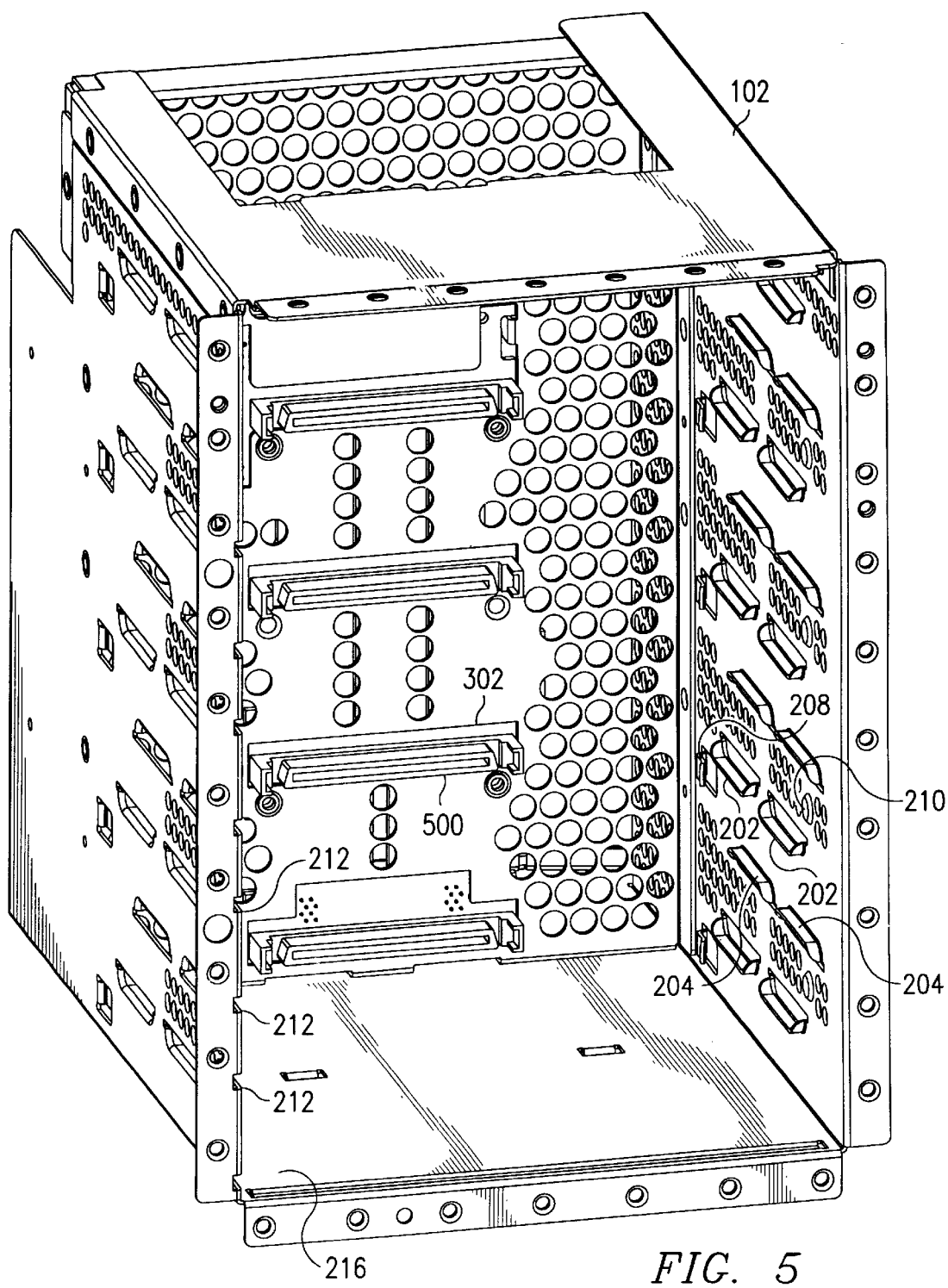
FIG. 5 is an isometric view of the drive cage of FIG. 1 after having electrical sockets installed therein.
Figure 6:
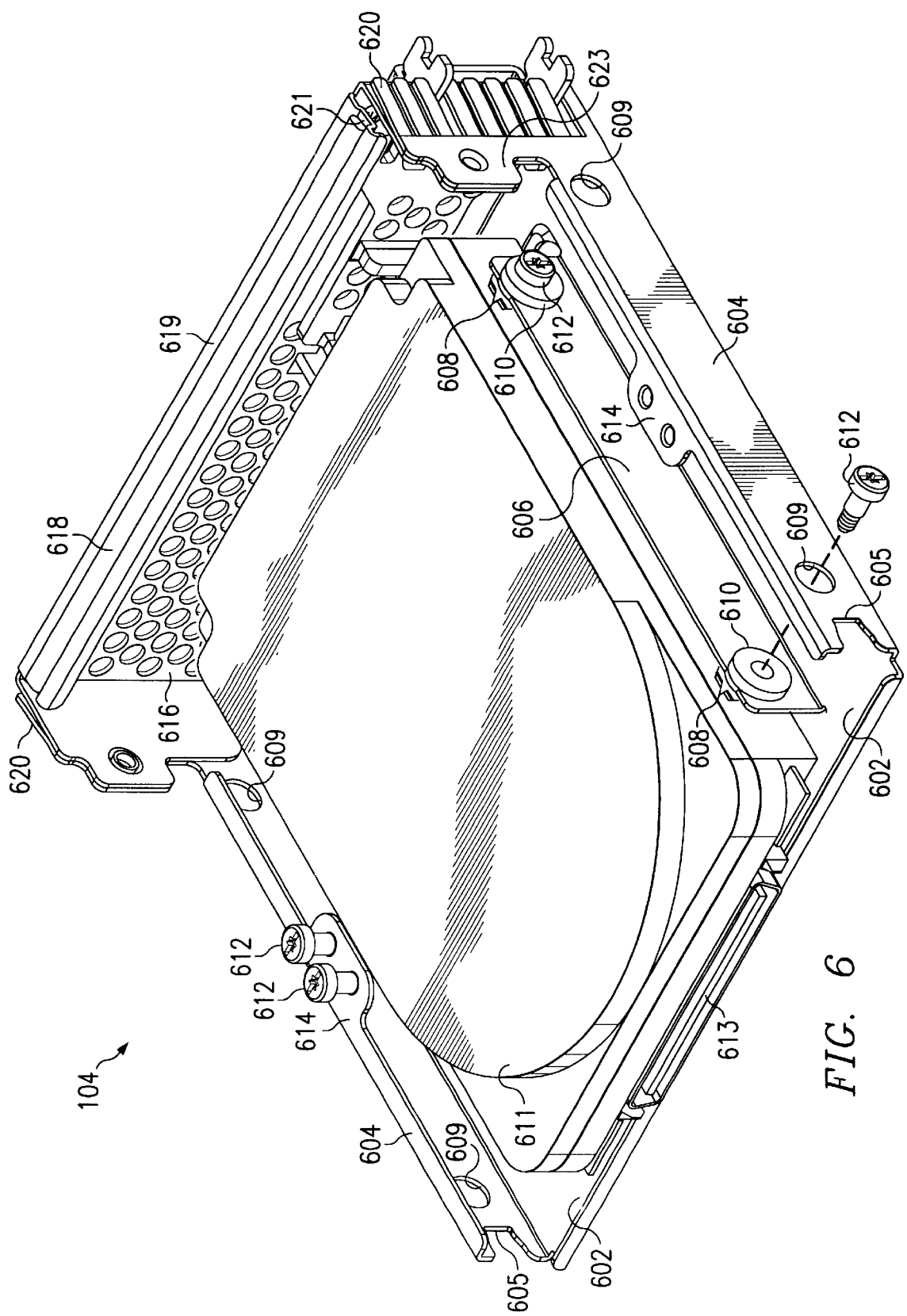
FIG. 6 is an isometric view of one of the drive brackets of FIG. 1 illustrating preferred installation of a drive therein.
Figure 7:
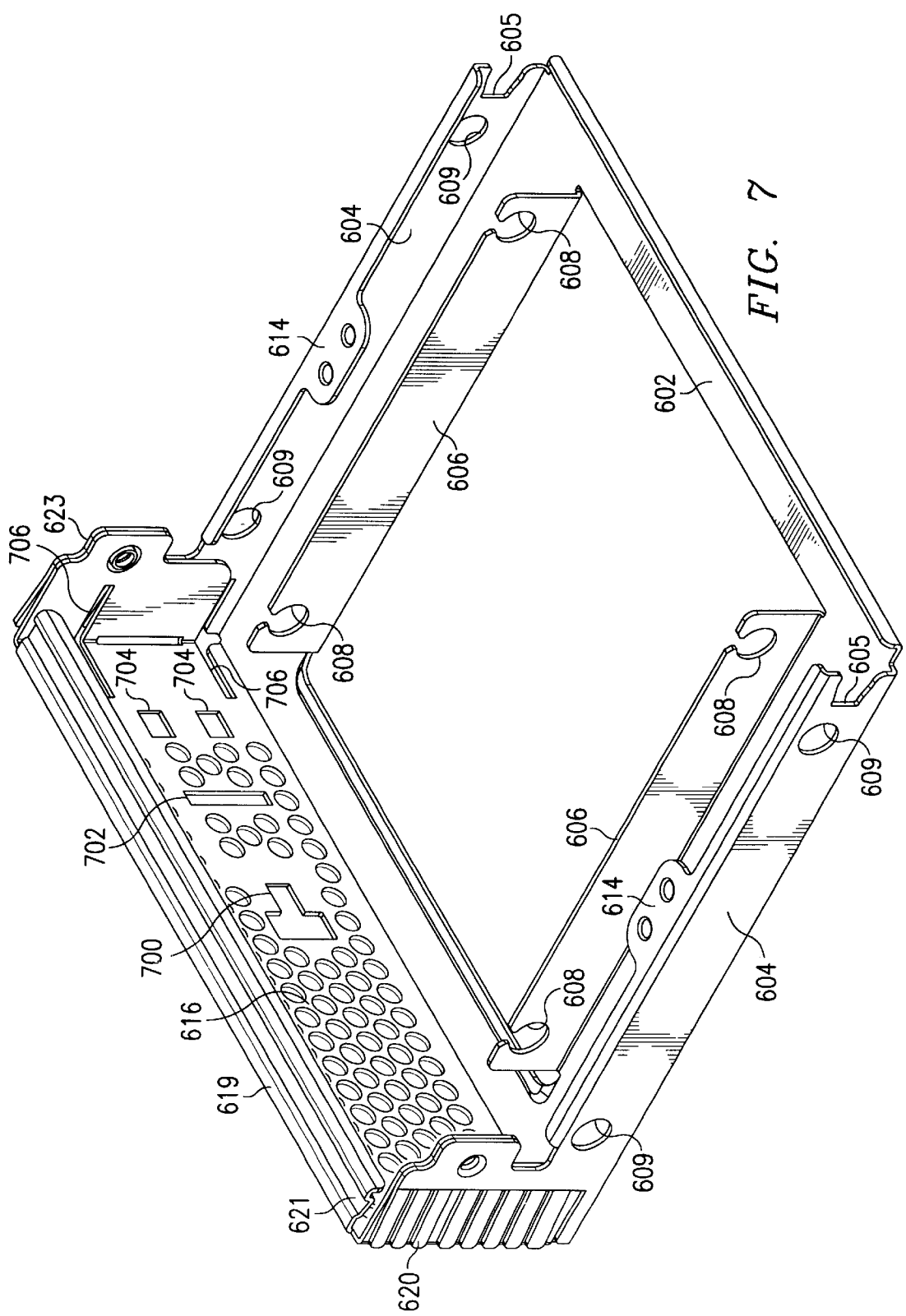
FIG. 7 is an isometric view of the drive bracket of FIG. 6 with the drive removed.
Figure 8:
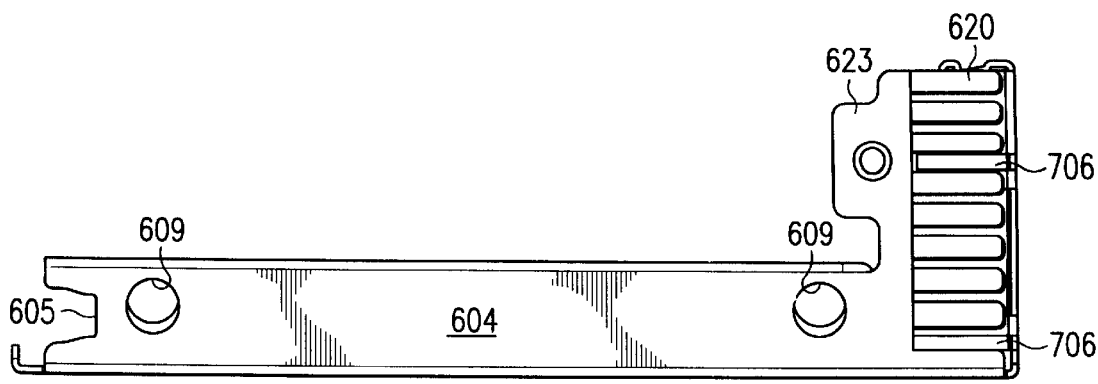
FIGS. 8 and 9 are side and front orthogonal views, respectively, of the drive bracket of FIG. 7.
Figure 9:
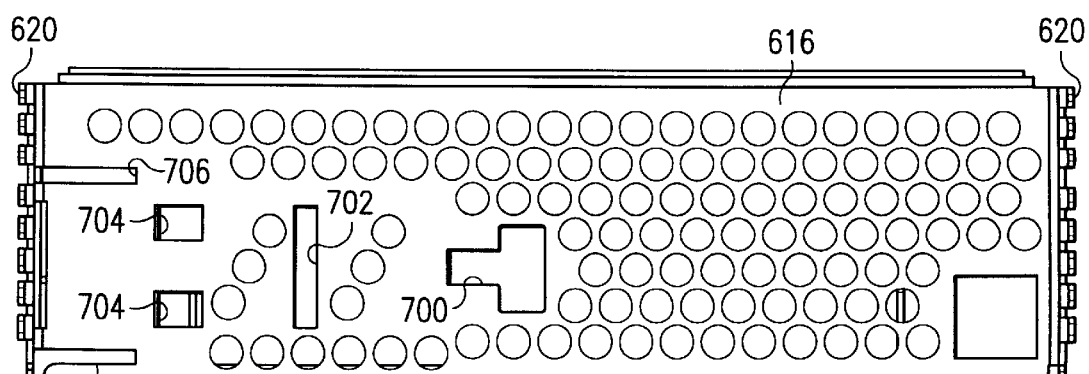
Figure 10:
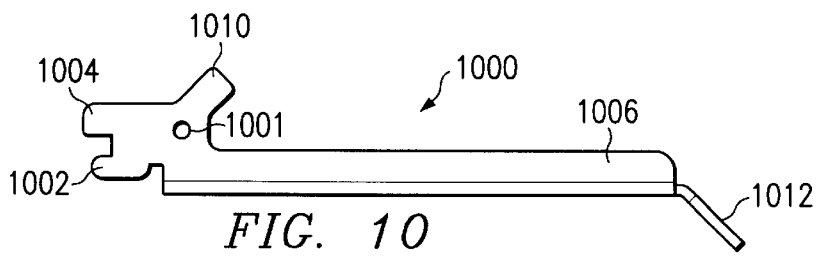
FIGS. 10 and 11 are top orthogonal and isometric views, respectively, of the rotating member of one of the insertion/ejection mechanisms of FIG. 1.
Figure 11:
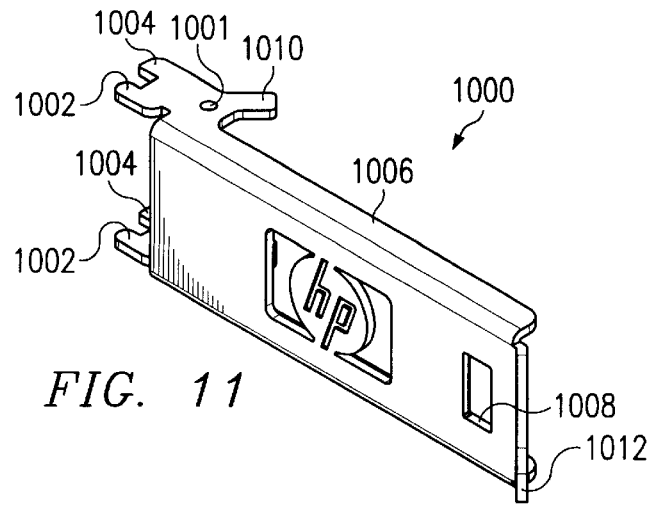
Figure 12:
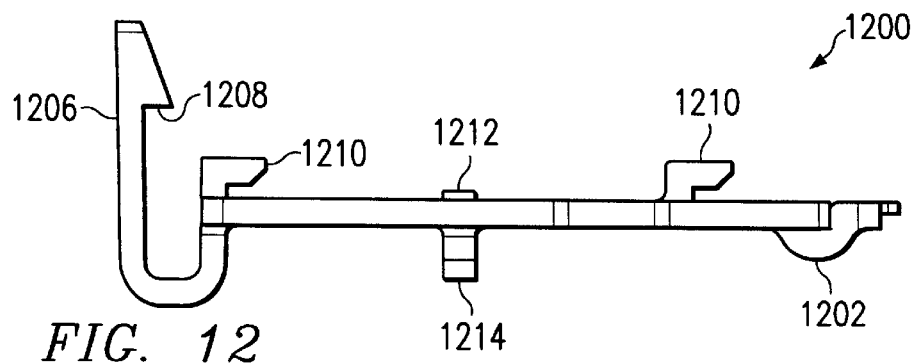
FIG. 12 is a top orthogonal view of the lever lock of one of the insertion/ejection mechanisms of FIG. 1.
Figure 13:
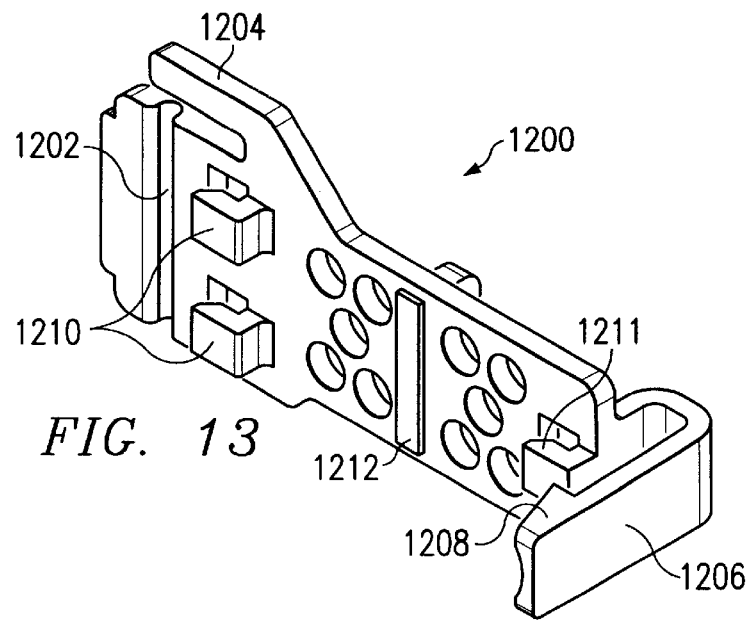
FIGS. 13 and 14 are back and front isometric views, respectively, of the lever lock of FIG. 12.
Figure 14:
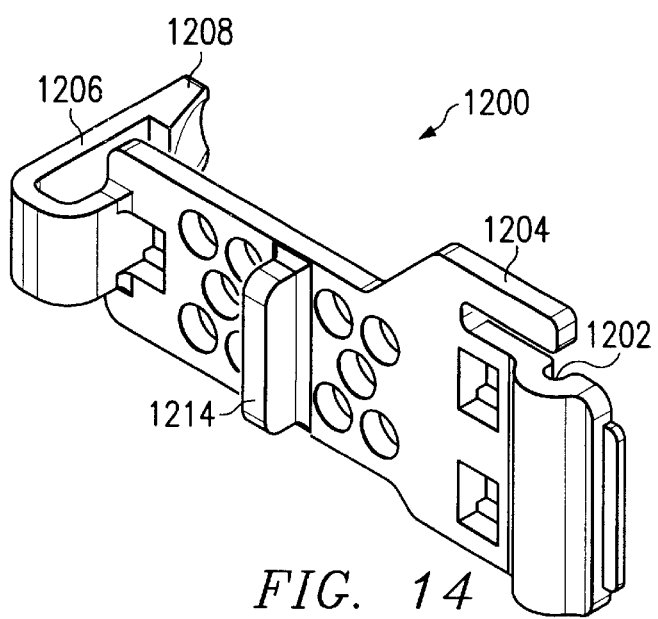
Figure 15:
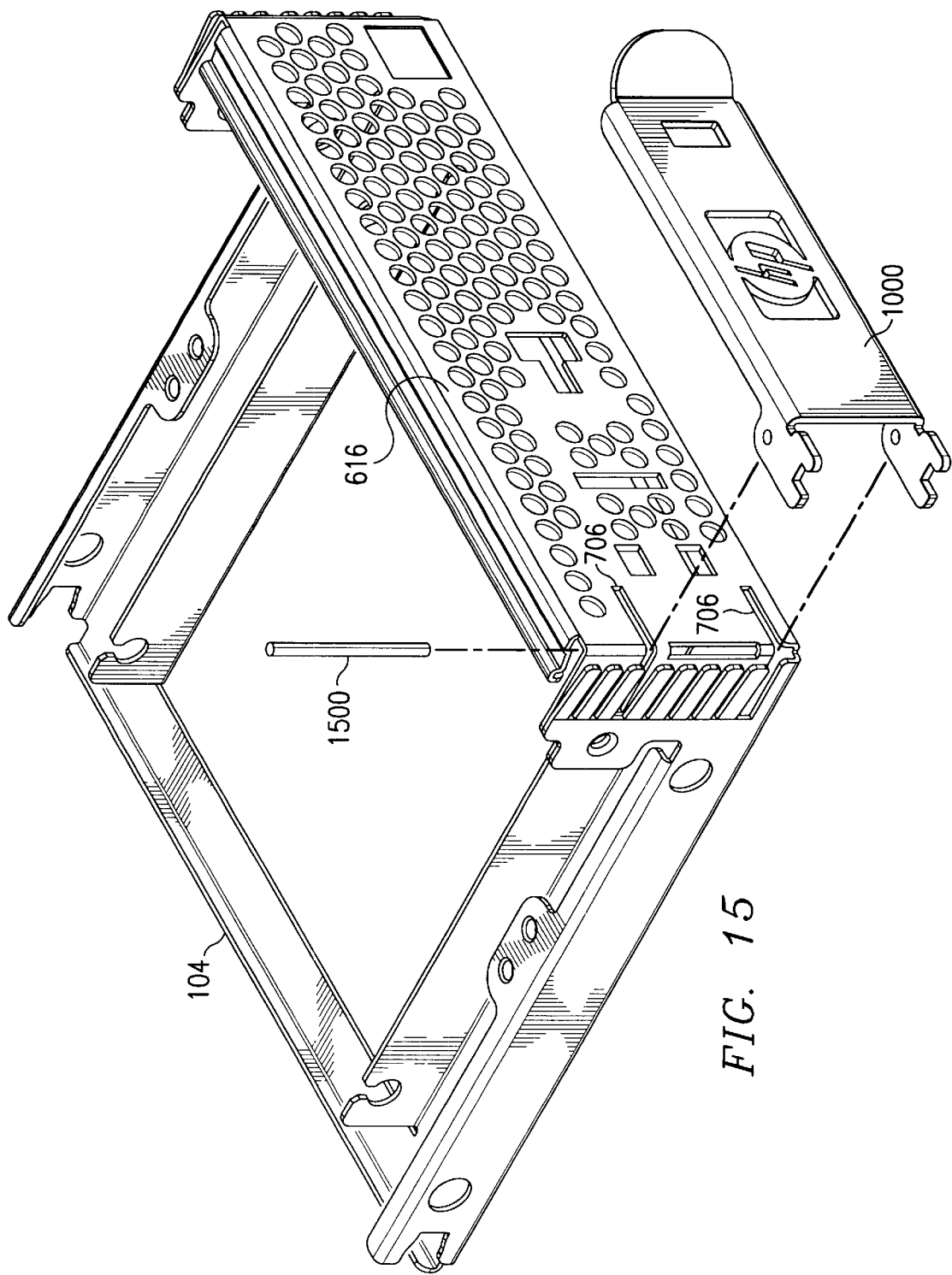
FIG. 15 is an exploded isometric view illustrating the installation of the rotating member of FIG. 10 into the drive bracket of FIG. 7.
Figure 16:
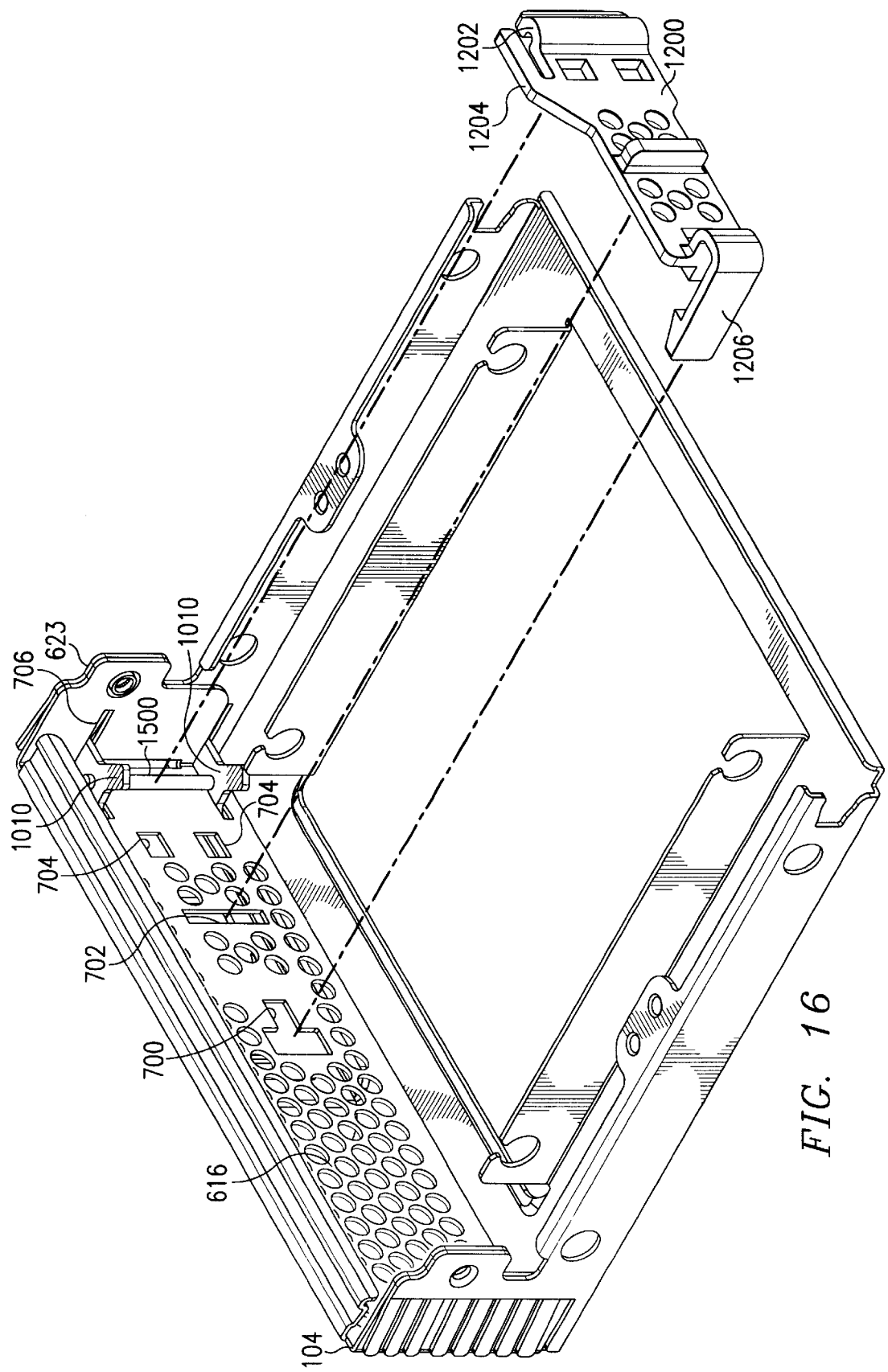
FIG. 16 is an exploded isometric view illustrating the installation of the lever lock of FIG. 12 into the drive bracket of FIG. 7.

Drive Mounting System. FIG. 1 illustrates a drive mounting system 100 according to a preferred embodiment of the invention. Drive mounting system 100 includes a drive cage 102 and one or more drive brackets 104. Each drive bracket 104 includes a locking insertion/ejection mechanism 106.

Drive Cage. Drive cage 102 will now be described in detail with reference to FIGS. 2–5. Drive cage 102 is constructed using a conductive material such as steel and is adapted to be mounted to the chassis of a computer enclosure by conventional means such as rivets, screws or bolts. Preferably, drive cage 102 will be mounted to the chassis in such a manner that front portion 400 will be easily accessible after any external cosmetic enclosure components are swung out of the way or removed. Drive bay 102 includes bottom wall 216, right and left side walls 200, 201, a rear wall 300, and a top portion 304. In the embodiment shown, top portion 304 is an additional drive bay; in other embodiments, a top wall may be substituted for the additional drive bay and placed across drive cage 102 at height 306. In either embodiment, drive cage 102 acts as a partial shield against leakage of electromagnetic energy from the computer enclosure in the area defined by front portion 400. Moreover, because drive cage 102 includes a conductive wall on each of its interior sides, it is able to perform this electromagnetic interference ("EMI") shielding function even when drive cage 102 is not populated with drive brackets.

In the embodiment shown, deformations are created in side walls 200, 201 to create four stacked drive bracket guides 218 disposed below top portion 304. Drive bracket guides 218 include top guide protrusions 202 and bottom guide protrusions 204. Together, top and bottom guide protrusions 202, 204 define a channel 206 through which an outer rail 604 of a drive bracket 104 may pass. The height of channel 206 should be just large enough to clear outer rail 604 of the drive bracket 104 so that protrusions 202, 204 will not only support bracket 104 but will also help to provide vertical alignment for bracket 104 within channel 206. Likewise, the inside distance between right and left walls 200, 201 should be just large enough to clear the width of bracket 104 so that horizontal alignment is also provided.

Insertion stops 208 protrude into channel 206 to prevent bracket 104 from being inserted too deeply within drive cage 102. When bracket 104 has been completely inserted, insertion stops 208 will engage notches 605 of bracket 104, thus preventing further insertion. The hooked shape of insertion stops 208 enables them to engage the inner surface of outer rails 604 and thus retain outer rails 604 against right and left walls 200, 201 of drive cage 102, providing additional horizontal alignment. Misinsertion stops 210 protrude into drive cage 102 above channel 206 so that, if bracket 104 is inserted too high, complete insertion will not be possible. (Misinsertion stops 210 will engage notches 605 and prevent further insertion.) In alternative embodiments, misinsertion stops 210 may be placed below channels 206. In the embodiment shown, however, the function of bottom guide protrusions 204 is provided by bottom wall 216 for the bottom-most bracket guide in the stack; therefore misinsertion stops 210 are positioned above, not below, each of channels 206.

Rear wall 300 includes a socket support 302 for each bracket guide 218. In the embodiment shown, socket support 302 is the periphery of a hole in rear wall 300. Preferably, a printed circuit board assembly having sockets 500 electrically connected to it is mounted to rear wall 300 by conventional means, such as by standoffs and screws or bolts. The mounting of the printed circuit assembly and the location of socket support 302 must be designed so that each socket 500 is accessible through the interior of drive cage 102 and will be aligned with a mating socket 613 when drive bracket 104 is inserted.

A flange 214 is formed along the front edge of left wall 201 of drive cage 102. Clearance slots 212 are formed in flange 214 and in the front-most portion of wall 201, as shown. The function of clearance slots 212 will be described in more detail below in the context of discussing insertion/ejection mechanism 106.

Drive Bracket. Drive bracket 104 will now be described in detail with reference to FIGS. 6–9. Drive bracket 104 is constructed using a conductive material such as steel and may be formed from a single piece by folding.

Front panel 616 extends upward from frame 602 and includes an EMI flange 619 having a longitudinal recess 621 formed therein. A metallized fabric EMI gasket 618 is glued or otherwise fixed along recess 621, as shown. Outer rails 604 extend upward along the outside length of frame 602 from front to back. Inner rails 606 extend upward along the inside length of frame 602, substantially parallel with outer rails 604. Each of outer rails 604 includes two screwdriver clearance holes 609. Each of insides rails 606 includes two grommet retainer holes 608. In the embodiment shown, grommet retainer holes 608 are open at the top to facilitate installation of rubber isolation grommets 610. In other embodiments, the holes may be formed with no gaps, and the grommets may be inserted through the holes themselves. Each outer rail 604 has a rearward-opening notch 605 formed therein, for engaging insertions stops 208 and misinsertion stops 210 in drive cage 102. A shoulder 614 is formed approximately midway down the length of each of outer rails 604. Each shoulder 614 includes placeholder holes for storing disk mounting screws 612 when the screws are not in use.

Conductive fingers 620 are disposed at each side of front panel 616. Each conductive finger 620 is bent slightly outward to enhance electrical contact between drive bracket 104 and drive cage 102 when drive bracket 104 is inserted into drive cage 102. Each set of conductive fingers 620 creates an EMI gasket.

Two clearance slots 706 are formed at the corner of front panel 616 and side portion 623, as shown. Clearance slots 706 are for receiving lever 1006 of insertion/ejection mechanism 106 (to be further described below). Holes 700, 702 and 704 are formed in front panel 616 for receiving lever lock 1200 of insertion/ejection mechanism 106 (also to be further described below).

Disk or tape drive 611 is installed into drive bracket 104 by inserting screws 612 through isolation grommets 610. Screwdriver clearance holes 609 are aligned with grommet retaining holes 608 to allow screwdriver access to screws 612 during drive installation and removal. Preferably, drive 611 will have a socket 613 disposed at its rear, as shown, for engagement with a mating socket 500 supported on rear wall 300 of drive cage 102.

Insertion/Ejection Mechanism. Insertion/ejection mechanism 106 will now be described in detail with reference to FIGS. 10–19. Insertion/ejection mechanism 106 includes rotating member 1000, lever lock 1200, hinge pin 1500 and spring 1800.

Rotating member 1000 has two aligned points of rotation (hinge pin clearance holes) 1001 formed therein. Two sets of prongs 1002, 1004 are disposed on one side of points of rotation 1001, and lever 1006 is disposed on the other side of points of rotation 1001. Two kickstands 1010 extend radially away from points of rotation 1001 at approximately forty-five degrees relative to lever 1006. Lever 1006 has a lever lock clearance hole 1008 formed therein for lockingly receiving and releasably retaining catch 1208 on lever lock 1200. Lever 1006 also has a handle 1012 formed on one end, as shown, to facilitate movement of lever 1006 and to facilitate pulling drive bracket 104 out of drive cage 102. In an embodiment, rotating member 1000 was constructed of steel; other suitable materials may be used.

Lever lock 1200 is designed to retain rotating member 1000 and hinge pin 1500 against front panel 616 of drive bracket 104, and also to releasably retain lever 1006 in a closed position. Lever lock 1200 includes a hinge pin retaining hub 1202 and a hinge pin retaining arm 1204 disposed at one end of hub 1202. Lever lock 1200 also includes a resilient standoff member 1206 having a catch 1208 formed on its end. Mounting hooks 1210, 1211 and a positioning stub 1212 are provided for engaging corresponding holes in front panel 616 of drive bracket 104. (The engagement of mounting hooks 1210, 1211 with front panel 616 will be described in more detail below with reference to FIG. 17.) Handle 1214 is provided to facilitate installation of lever lock 1200 onto front panel 104. In an embodiment, lever lock 1200 was constructed of molded plastic; other suitable materials may be used. Hinge pin 1500 was constructed of steel. Spring 1800 was constructed of blue spring steel. Other suitable materials may be used for either piece. It was found that a radius of approximately 3.8 mm and a thickness of approximately 0.005 inches for spring 1800 provided satisfactory results for biasing lever 1006 toward its open position while still enabling it to be moved to its closed position without undue force.

The installation of insertion/ejection mechanism 106 onto front panel 104 will now be described with reference to FIGS. 15–19. In step one (FIG. 15), rotating member 1000 is inserted into clearance slots 706 so that hinge pin clearance holes 1001 are disposed on the interior of drive bracket 104 at the corner. Hinge pin 1500 is then inserted through hinge pin clearance holes 1001. After hinge pin 1500 is so inserted, rotating member 1000 may then be slid a small distance toward the center of front panel 616 in preparation for step two.

Figure 17:
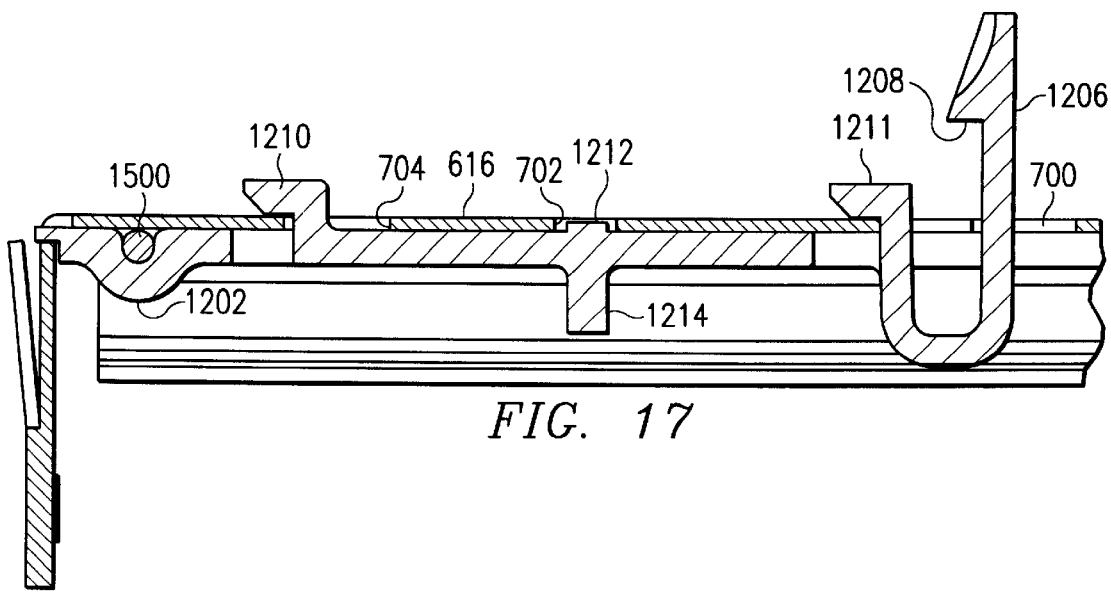
FIG. 17 is a sectional view illustrating the completed installation indicated in FIG. 16.
Figure 18:
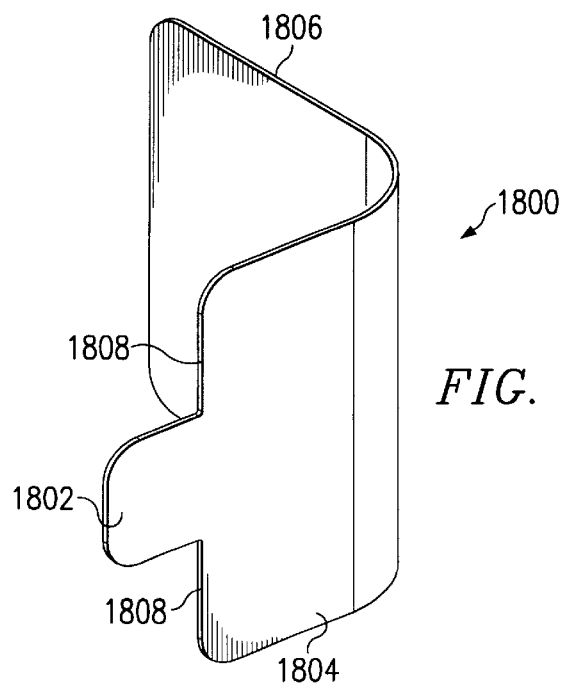
FIG. 18 is an isometric view of the spring of one of the insertion/ejection mechanisms of FIG. 1.
Figure 19:
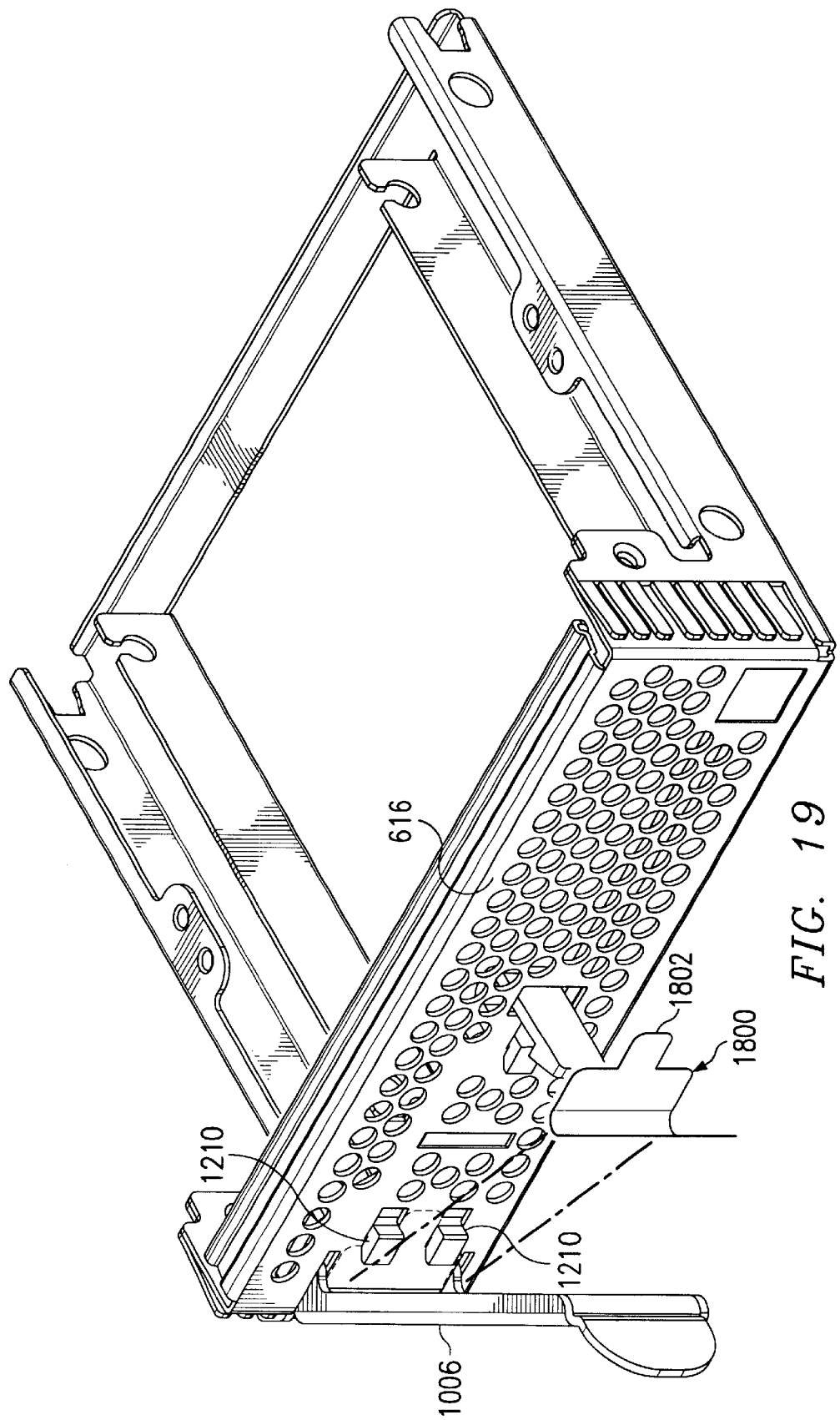
FIG. 19 is an isometric view illustrating the installation of the spring of FIG. 18 into the insertion/ejection mechanism.

In step two (FIG. 16), lever lock 1200 is mounted to the interior side of front panel 616. To do so, retaining hub 1202 is placed over hinge pin 1500 so that the top kickstand 1210 slides into the space between retaining arm 1204 and the top end of hub 1210. Resilient standoff member 1206 and hook 1211 are both inserted into hole 706, and hooks 1210 are inserted into holes 704. At this point, positioning stub 1212 will not be aligned with holes 702. To complete the step, lever lock 1200 is slid along the inside surface of front panel 616 until positioning stub 1212 snaps into hole 702. After this has occurred, hooks 1210 will have engaged one edge of holes 704, and hook 1211 will have engaged one edge of hole 700, as shown in FIG. 17.

In step three (FIG. 19), rotating member 1000 is placed in its open position, and spring 1800 is wedged into place as shown. Once spring 1800 is in position, leaf 1806 rests against the inside surface of lever 1006, leaf 1804 rests against the outside surface of front panel 616, shoulders 1808 rest against the inside of hooks 1210, and protrusion 1802 is disposed between hooks 1210.

Figure 20:
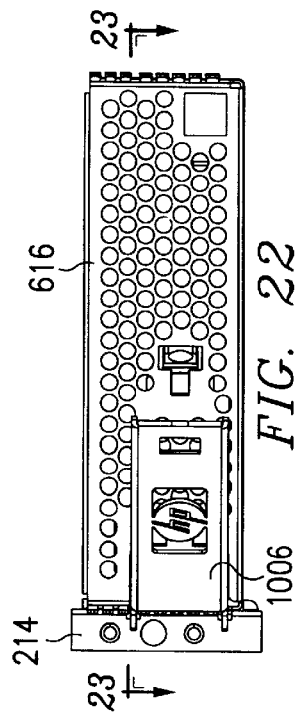
FIGS. 20 and 21 are front and top orthogonal views, respectively, illustrating the insertion/ejection mechanism in its closed position and the drive bracket installed within the drive cage.
Figure 21:
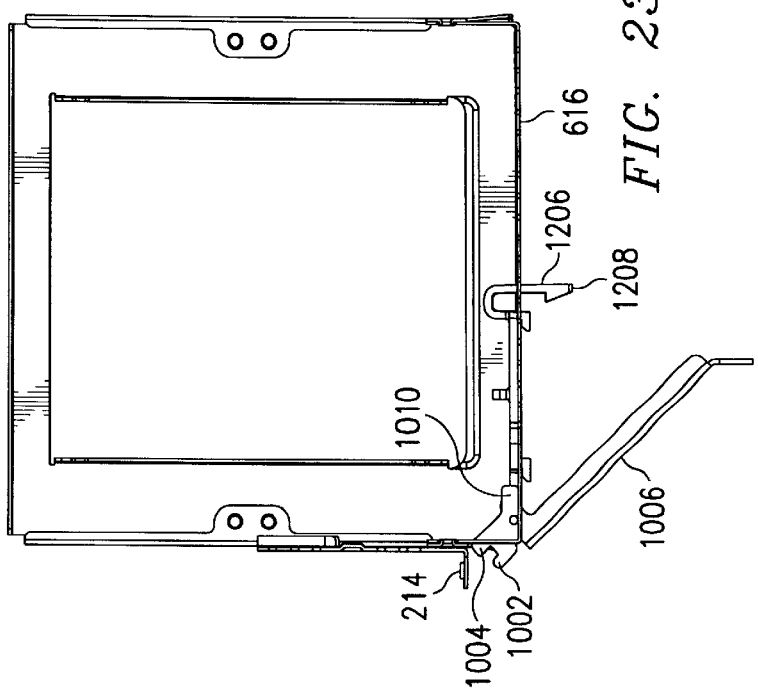
Figure 22:
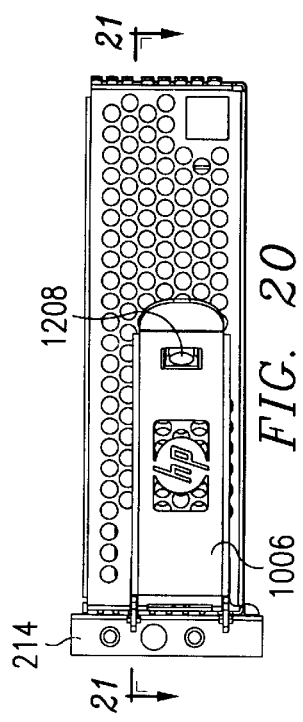
FIGS. 22 and 23 are front and top orthogonal views, respectively, illustrating the insertion/ejection mechanism in its open position, and the drive bracket in the process of being install or removed from the drive cage.
Figure 23:
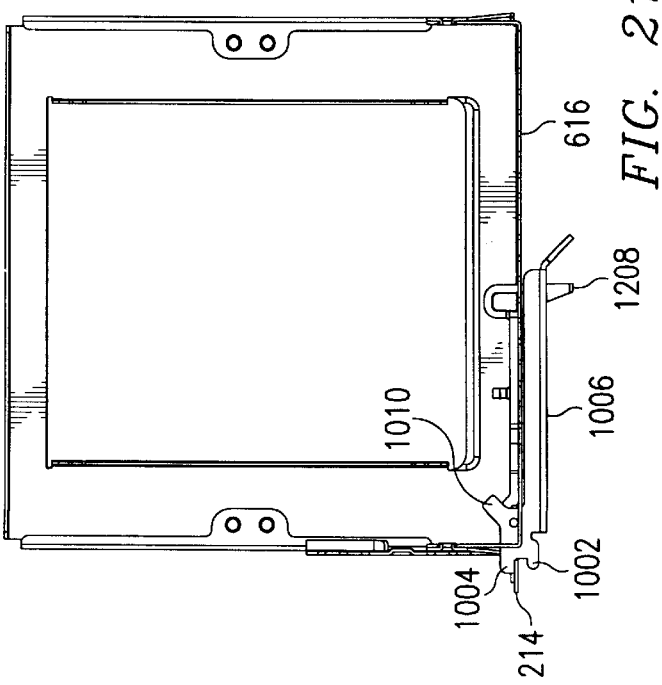

Operation. The preferred operation of drive mounting system 100 will now be described with reference to FIGS. 20–26. To install a drive bracket 104 into drive cage 102, lever 1006 is placed in its open position, as shown in FIGS. 22–23. Note that, in the open position, kickstands 1010 engage the inside surface of front panel 616 to prevent lever 1006 from opening too far. Outer rails 604 are inserted into channels 206 in drive a bracket guide 218, and drive bracket 104 is pushed into drive cage 102. Prongs 1004 will pass through clearance slots 706, but prongs 1002 will not. Once prongs 1002 have engaged the front surface of flange 214, prongs 1004 will have passed at least partially through the plane of flange 214. Then, lever 1006 is moved to its closed position. As lever 1006 is closed, prongs 1004 engage the back surface of flange 215. The movement of lever 1004 to the closed position, and the engagement of prongs 1004 with the back surface of flange 214, tends to push bracket 104 further into drive cage 102, preferably until socket 613 has mated with socket 500. As lever 1006 nears the completely closed position, resilient standoff member 1206 bends back slightly as catch 1208 engages one side of hole 1008. Once lever 1006 is in the completely closed position, standoff 1206 snaps back, and the bottom of catch 1208 engages the outside surface of lever 1006, thereby retaining it in the closed position as shown in FIGS. 20–21.

To remove drive bracket 104 from drive cage 102, catch 1208 is pulled back so that lever 1006 may spring open. As lever 1006 springs open, prongs 1002 engage the front surface of flange 214. The user may then assist lever 1006 to the fully open position. The movement of lever 1006 to the open position, and the engagement of prongs 1002 with the front surface of flange 214, tends to pull bracket 104 out of drive cage 102, and helps to disengage socket 613 from socket 500.

Figure 24:
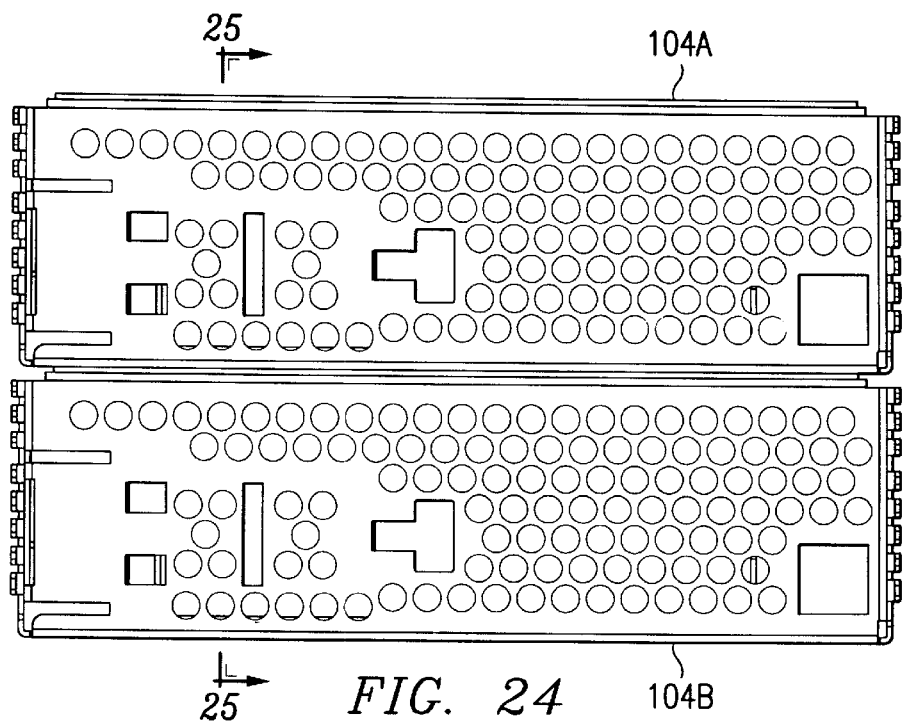
FIGS. 24 and 25 are front and side orthogonal views, respectively, illustrating a preferred stacked arrangement of and EMI seal between the drive brackets when they are installed in the drive cage.
Figure 25:
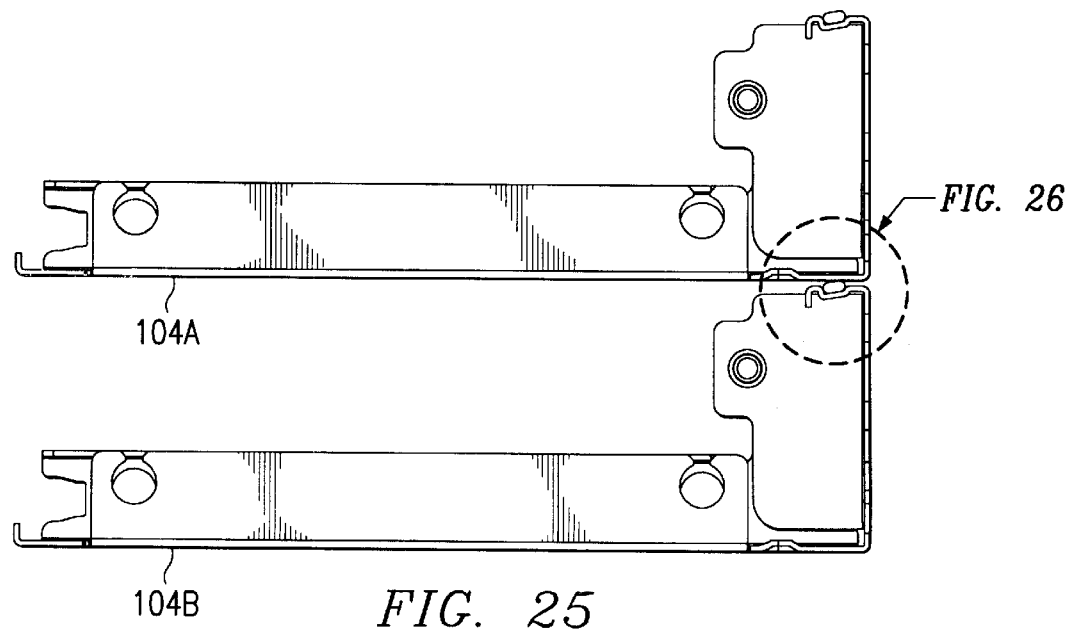
Figure 26:
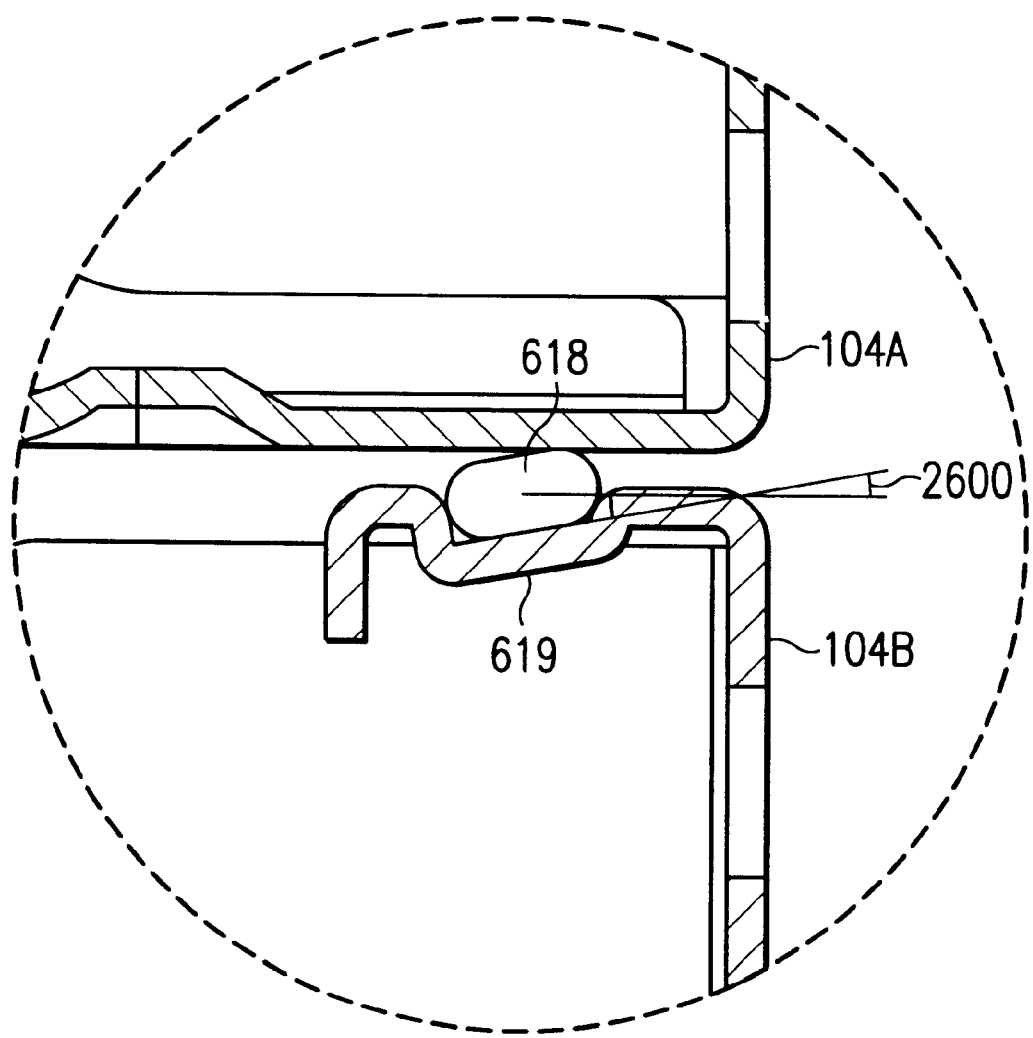
FIG. 26 is a sectional close-up view of the EMI seal illustrated in FIG. 25.

FIGS. 24–26 are provided to illustrate an EMI-reducing feature of an embodiment of the invention. Because of the stacked arrangement of drive bracket guides 218 in cage 102, the drive brackets 104 populating cage 102 will reside immediately adjacent to one another, one on top of the other as illustrated by brackets 104A and 104B. When two drive brackets are so installed, the metallized foam gasket 618 on the lower bracket 104B will form an EMI seal against the bottom of upper bracket 104A. Flange 619 is tilted at angle 2600 (approximately 5–10 degrees) so that relative motion between brackets 104A and 104B does not peel away or roll. This aspect of the preferred embodiment allows metallized foam gaskets to be used in the application in lieu of more expensive or less effective types of EMI gaskets.

While the invention has been described in detail in relation to preferred embodiments thereof, the described embodiments have been presented by way of example and not by way of limitation. It will be understood by those skilled in the art that various changes may be made in the form and details of the described embodiments, resulting in equivalent embodiments that will remain within the scope of the appended claims.

What is claimed is:

1. A drive bracket comprising:

a) a bracket frame;

b) left and right outer rails fixed to the bracket frame;

c) left and right inner rails fixed to the bracket frame substantially parallel to the outer rails;

d) mounting holes in the inner rails that accept mounting screws substantially perpendicular to the inner rails such that the screws will engage side mounting holes in a drive; and e) at least one flange disposed between the left or right inner and outer rails, substantially perpendicular to the rails, the flange including holes for receiving and storing mounting screws.

2. The drive bracket of claim 1, further comprising mounting screws stored in the flange.

3. The drive bracket of claim 1 further comprising:

a) a front panel fixed to the bracket frame and extending upward from the bracket frame; and b) an EMI flange for accepting an EMI gasket on the upper edge of the front panel, the flange fixed to the front panel and tilted downward and toward the rear of the bracket frame.

4. The drive bracket of claim 3 wherein the EMI flange is fixed to the front panel with a downward tilt angle of between five and ten degrees from horizontal.

5. A method of storing drive mounting screws comprising the steps of:

a) providing a drive bracket comprising a drive bracket frame, left and right outer rails fixed to the bracket frame, left and right inner rails fixed to the bracket frame substantially parallel to the outer rails, mounting holes in the inner rails that accept mounting screws substantially perpendicular to the inner rails such that the screws will engage side mounting holes in a drive, at least one flange disposed between the left or right inner and outer rails, substantially perpendicular to the rails, the flange including holes for receiving and storing mounting screws; and b) storing mounting screws in the holes.

* * * * *